United States Patent [19]
Murakami

[11] Patent Number: 5,552,719
[45] Date of Patent: Sep. 3, 1996

[54] OUTPUT BUFFER CIRCUIT HAVING GATE VOLTAGE CONTROL CIRCUIT OF GATE CURRENT CONTROLLING TRANSISTOR CONNECTED TO OUTPUT TRANSISTOR

[75] Inventor: Nobuo Murakami, Tokyo, Japan

[73] Assignee: NEC Corporation, Tokyo, Japan

[21] Appl. No.: 362,896

[22] Filed: Dec. 23, 1994

[30] Foreign Application Priority Data

Dec. 24, 1993 [JP] Japan ..................... 5-327061

[51] Int. Cl.⁶ ............................. H03K 19/0948
[52] U.S. Cl. ............................................. 326/27
[58] Field of Search ....................... 326/27, 58, 83, 326/121, 122; 327/380, 381, 387, 391, 392, 398, 399

[56] References Cited

U.S. PATENT DOCUMENTS

| | | | |
|---|---|---|---|
| 5,111,076 | 5/1992 | Tarng ............................... | 326/27 |
| 5,194,764 | 3/1993 | Yano et al. ....................... | 326/27 |
| 5,233,238 | 8/1993 | Mattos ............................. | 326/27 |
| 5,237,213 | 8/1993 | Tanoi ............................... | 327/379 |

FOREIGN PATENT DOCUMENTS

| | | | |
|---|---|---|---|
| 63-35942 | 8/1989 | Japan ............................... | 326/27 |
| 4-37216 | 2/1992 | Japan . | |

*Primary Examiner*—Edward P. Westin
*Assistant Examiner*—Benjamin D. Driscoll
*Attorney, Agent, or Firm*—Foley & Lardner

[57] ABSTRACT

The output buffer circuit according to the present invention comprises: a P-channel type output transistor which is provided between a first power supply terminal and an output terminal and receives an input signal at a gate thereof; an N-channel type transistor which is provided between the output terminal and a second power supply and has a gate connected to a drain of a gate current controlling transistor; a circuit for supplying the input signal to a source of the gate current controlling transistor; and a voltage control generation circuit which generates as a gate voltage of the gate current controlling transistor a first voltage value which is smaller than a value of the power supply voltage for a predetermined time, and further generates a second voltage value which is higher than the first voltage value after the elapse of the predetermined time.

9 Claims, 6 Drawing Sheets

OUTPUT BUFFER CIRCUIT HAVING GATE VOLTAGE CONTROL CIRCUIT OF GATE CURRENT CONTROLLING TRANSISTOR CONNECTED TO OUTPUT TRANSISTOR

BACKGROUND OF THE INVENTION

1. Field of the Invention

The present invention relates to an output buffer circuit, and more particularly to an output buffer circuit for controlling the discharge current which flows when the ground potential is output.

2. Description of the Prior Art

As a final output means of a semiconductor memory circuit, for example, an output buffer circuit shown in FIG. 1 is conventionally used. In this circuit, when a control signal C is at an inactive level (high level), a P-channel type transistor 1 and an N-channel type transistor 2 constituting an output transistor are turned OFF. Meanwhile, when the control signal C is ON an active level (low level), either of the P-channel type transistor 1 or the N-channel type transistor 2 is turned ON to generate an output signal B on the high or low level in accordance with a level of an input signal A in this circuit. To a gate of the N-channel type transistor 2 is connected an N-channel type zero-threshold transistor 11. The reason why this transistor 11 is provided is described as follows. If the transistor 11 is not provided, the N-channel type transistor 2 rapidly responds to a change in the input signal A to perform the ON/OFF operation. In particular, when the N-channel type transistor 2 is turned from the OFF state to the ON state, there occurs such a problem that a large amount of the current instantaneously flows to a ground power supply GND, increasing the ground potential (noise generation). As a countermeasure, to the gate of the N-channel type transistor 2 is connected the transistor 11 which functions as a resistance element which receives at a gate thereof a predetermined voltage S supplied from a constant voltage generation circuit 50 and has a predetermined resistance value. The speed of change in the gate potential of the transistor 2 is decreased because of the existence of the transistor 11. In other words, the speed of the ON/OFF operation of the transistor 11 is decreased, and consequently, a large amount of the current does not flow to the ground power supply instantaneously, preventing the ground potential from being increased.

The buffer circuit shown in FIG. 1, however, has such a problem that the speed of the output operation is decreased since an input signal is always supplied to the gate of the transistor 2 through the transistor 11 functioning as the resistance element.

There is a prior art circuit (Japanese Patent Application Laid-Open No. Hei-4-37216 (1992), for example) which can selectively changeover the speed of the change in the gate potential of the output transistor, as shown in FIG. 2. The ON/OFF operation of an N-channel type transistor 54 is controlled by changing over the potential of a control terminal T, and the control is made upon whether the input signal is supplied through a P-channel type transistor 53 functioning as the resistance element.

With this prior art circuit, it is not possible to solve both of the problems, i.e., the increase of the ground potential and the decrease of in speed of the output operation, simultaneously. That is, when the potential of the control terminal T is at the low level, the transistor 54 is turned OFF. At this time, for example, when an input signal A is turned from the high level to the low level, the level of a gate potential 3 of a transistor 1 immediately becomes the high level, but the gate potential is slowly increased due to the transistor 53 functioning as the resistance element. Thus, the increase in the ground potential can be prevented similarly to the prior art shown in FIG. 1, but the speed of the output operation is decreased.

When the potential of the control terminal T is at the high level, the transistor 54 is turned ON. Since the resistance of the transistor 54 which is in the ON state is small, the gate potential 3 of the transistor 1 and a gate potential 4 of the transistor 2 rapidly vary in response to the change in the input signal A. Therefore, the speed of the output operation is increased, but a large amount of the current flows to the ground power supply GND, thereby rapidly increasing the ground potential.

As apparent from the above description, the conventional output buffer circuit can not prevent the rapid increase of the ground potential without decreasing the output operation speed.

BRIEF SUMMARY OF THE INVENTION

Object of the Invention

It is therefore an object of the present invention to provide an output buffer circuit being capable of preventing the ground potential from being increased without decreasing the output operation speed.

Summary of the Invention

An output buffer circuit according to the present invention comprises: a P-channel type output transistor which is provided between a first power supply terminal and an output terminal and receives an input signal from a gate thereof; an N-channel type output transistor which is provided between the output terminal and a second power supply and has a gate connected to a drain of a gate current controlling transistor; a means for supplying the input signal to a source of the gate current controlling transistor; and a voltage control generation circuit for generating as a gate voltage of the gate current controlling transistor a first voltage value which is smaller than a value of a power supply voltage for a predetermined time in response to a change of the level of the source of the gate current controlling transistor from a low level to a high level, and a second voltage value which is larger than the first voltage value after the elapse of the predetermined time.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
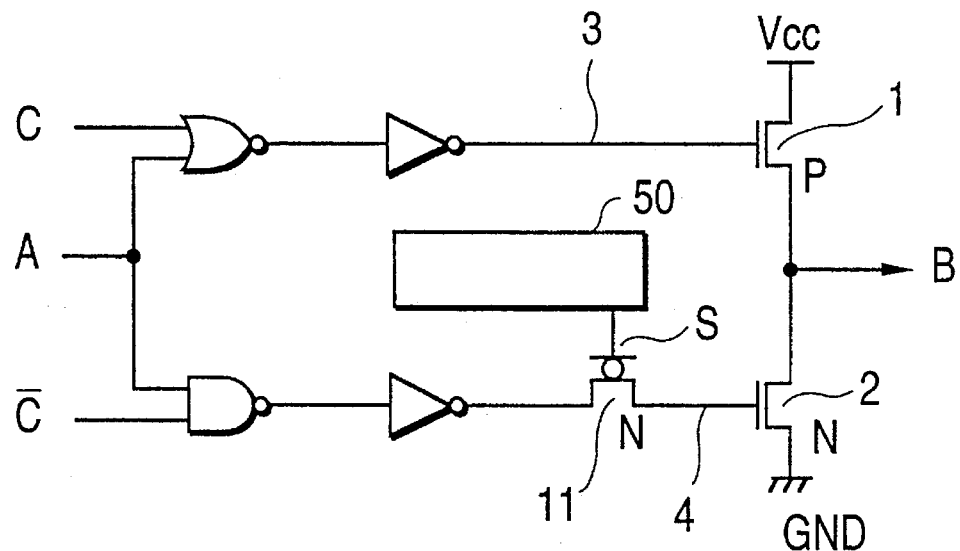
FIG. 1 is a circuit diagram showing a conventional output buffer circuit.
Figure 2:
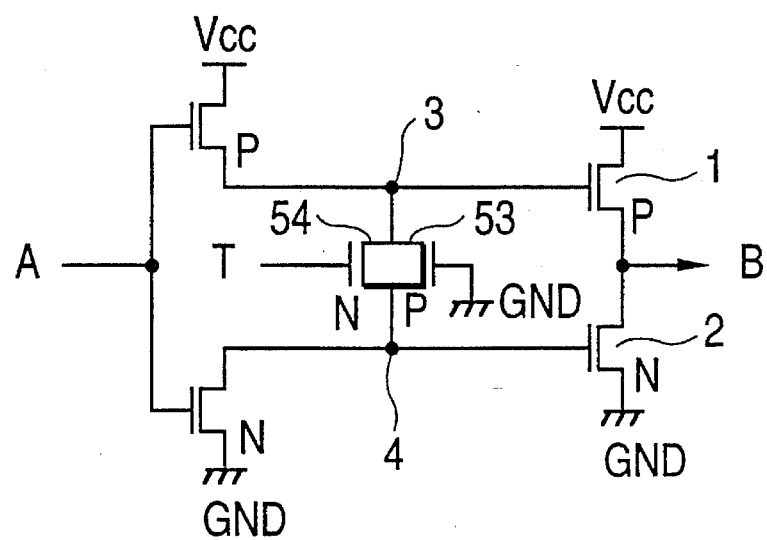
FIG. 2 is a circuit diagram showing another conventional output buffer circuit.
Figure 3:
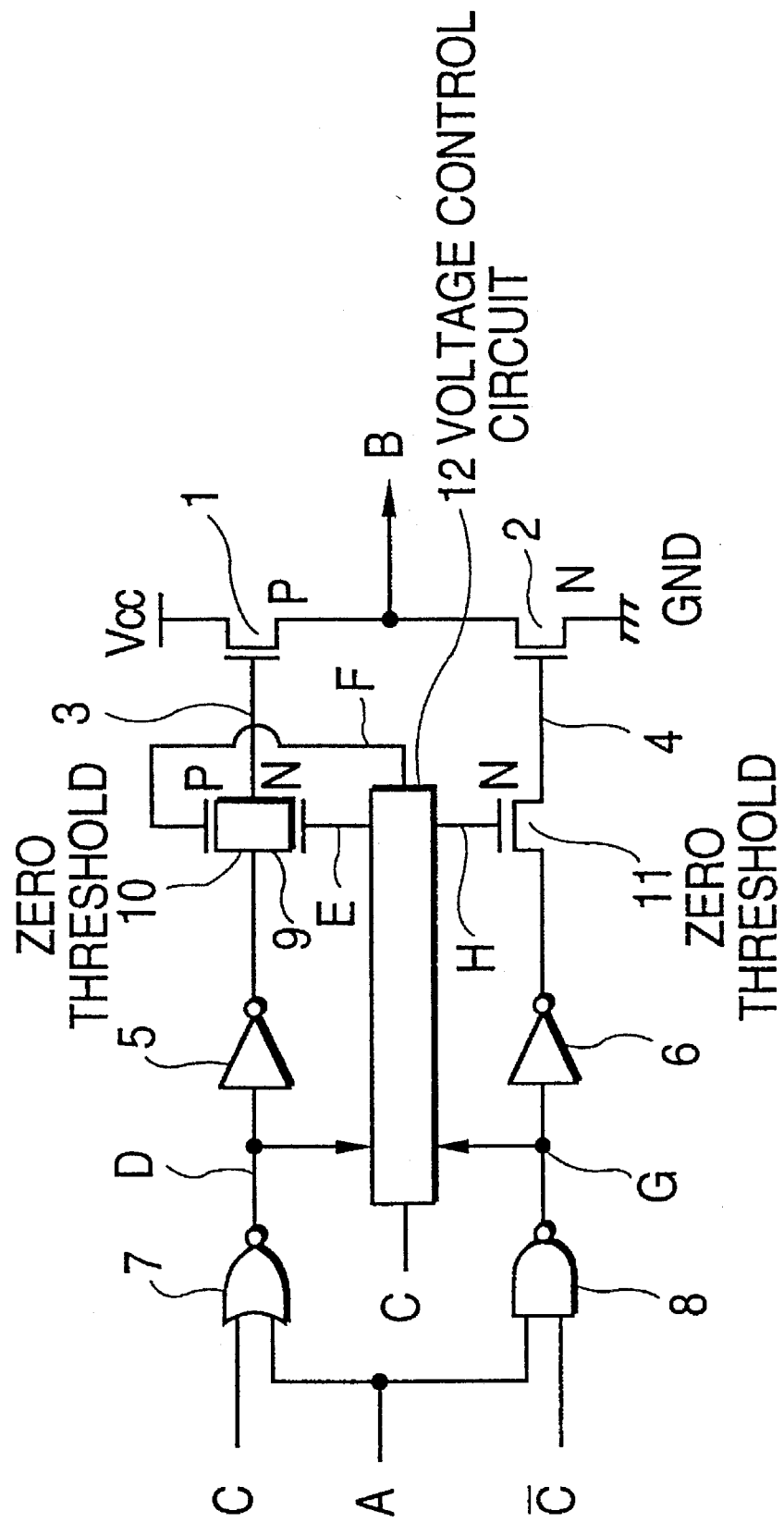
FIG. 3 is a circuit diagram of an output buffer circuit showing a first embodiment of the present invention.

A first embodiment according to the present invention will be described with reference to FIG. 3. In this embodiment, when a control signal C is at an inactive level (high level), a P-channel type transistor 1 and an N-channel type transistor 2 constituting an output transistor are turned OFF to become inactivated, meanwhile when the control signal C is at an active level (low level), either of the P-channel type transistor 1 or the N-channel type transistor 2 is turned ON to generate an output signal B which is at the high or low level.

In order to carry out the above-described operation, the control signal C inputs to an NOR circuit 7 and a voltage control circuit 12 and an inverted signal obtained from the control signal C inputs to an NAND circuit 8, respectively. When an input signal A inputs to the NOR circuit 7 and the NAND circuit 8 and the control signal C is at the active level (low level), inverted signals D and G obtained from the input signal A are outputed. The signal D is supplied to a gate of the P-channel type transistor 1 of the output transistor via a voltage control circuit 12 and, an inverter 5 and a transfer gate which is constituted by an N-channel type non-dope transistor 9 and a P-channel type transistor 10. The signal G is supplied to a gate of the N-channel type transistor 2 of the output transistor via a voltage control circuit 12 and, an inverter 6 and an N-channel type non-dope transistor 11. Here, the reason why the transistors 9 and 11 are the N-type non-dope transistors is that: the threshold voltage of the N-channel type non-dope transistor is lower than that of a normal N-type enhancement transistor (approximately 0 V); the N-type non-dope transistor can be always turned ON with a low gate voltage; and the current driving capability (resistance value) of the N-type non-dope transistor can be controlled with a voltage change lower than the power supply voltage $V_{cc}$. Accordingly, it is not necessary to use the zero-threshold type transistor in the present invention, and any transistor whose threshold value is set lower may be adopted.

Figure 6:
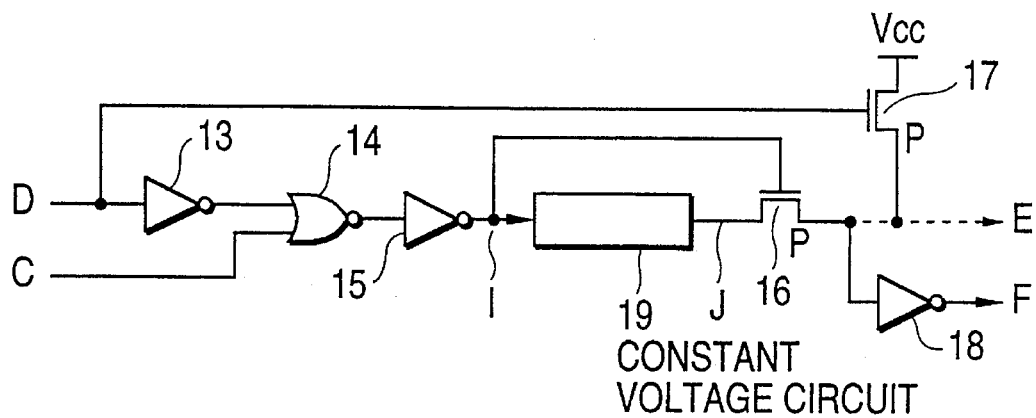
FIGS. 6 and 7 are circuit diagrams each showing the specific configuration of a voltage control circuit illustrated in FIG. 3.
Figure 7:
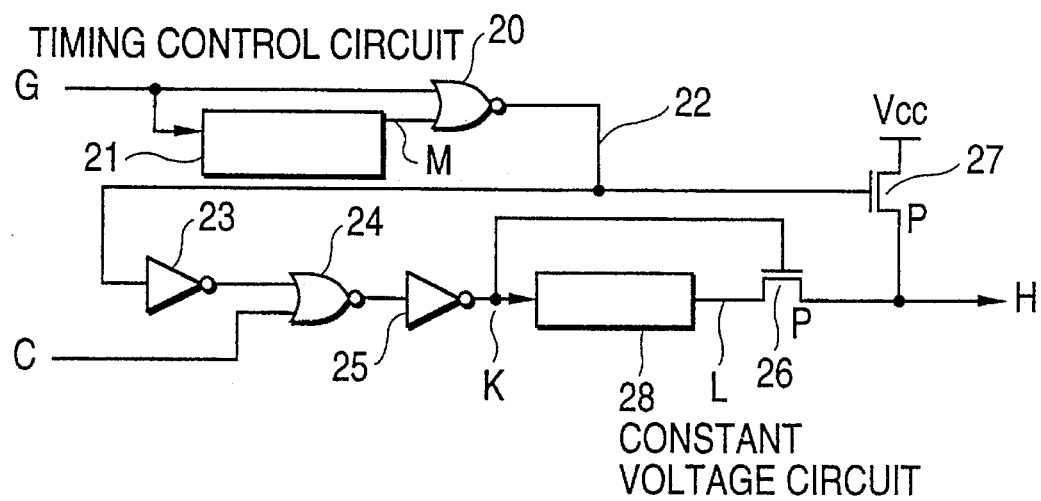

The present embodiment has such a characteristic that the voltage control circuit 12 controls the voltages of signals E, F and H in accordance with the signals D and G, and further controls changes in the voltages of the output transistors 1 and 2. Referring to FIGS. 6 and 7, the voltage control circuit 12 will now be explained.

The voltage control circuit 12 can be divided into two circuit configurations. One is a circuit shown in FIG. 6, and this circuit generates in accordance with the signal D the signals E and F to be fed to the gates of the N-channel type zero-threshold transistor 9 and the P-channel type transistor 10 which constitute the transfer gate. The other is a circuit shown in FIG. 7, and this circuit generates the signal H to be supplied to the gate of the N-channel type zero-threshold transistor 11 in accordance with the signal G.

As shown in FIG. 6, the signal D is supplied to both a gate of a P-channel type transistor 17 and an NOR circuit 14 via an inverter 13. When the control signal C is fed to the NOR circuit 14 and the control signal C is at the active level (low level), the output of the inverter 13 is supplied as a signal I through an inverter 15. The signal I is fed to both a gate of a P-channel type transistor 16 and a constant voltage circuit 19. The constant voltage circuit 19 outputs a ground level signal J when the signal I is at the high level, and the circuit 19 outputs the signal J having an intermediate potential ½ $V_{cc}$ when the signal I is at the low level (the detailed description will be given later). Since the signal D and the signal I are complementary to each other when the control signal C is at the active level, either of the transistor 17 or the transistor 16 is turned ON. When the signal D is at the high level, the transistor 16 is therefore tuned ON, and the signal J having the intermediate potential ½ $V_{cc}$ is output as the signal E. Since the potential of the input signal is set to be higher than the intermediate potential ½ $V_{cc}$ when the output is inverted in an inverter 18, the signal output from the inverter 18 is at the high level.

As for the circuit shown in FIG. 7, since members designated by Reference numerals 23 to 27 have the same structure as shown in FIG. 6, the explanation thereof is omitted. In the circuit shown in FIG. 7, a signal G is supplied to an NOR circuit 20 and a timing control circuit 21. The timing control circuit 21 delays an inverted signal obtained from the signal G by a predetermined time to output a signal M (the detailed description will be given later). Accordingly, since the output M of the timing control circuit 21 is turned from the low level to the high level after the elapse of a predetermined time t when the signal G is turned from the high level to the low level, the signal G and the signal M are at the low level during the time period t. Consequently, an output 22 of the NOR circuit 20 is at the high level and a P-channel type transistor 27 is turned OFF during this time period t.

The operation of this embodiment will now be described. First, when the control signal C is at the inactive level (high level), the signal D is at the low level while the signal G is at the high level. Since the signal E is at the high level, the signal F is at the low level and the signal H is at the high level in the voltage control circuit at this time, the transistors 9, 10 and 11 are turned ON. Accordingly, the high level signal is supplied to the gate 3 of the P-channel type transistor 1 and the low level signal is fed to the gate 4 of the N-channel type transistor 2, and hence the transistors 1 and 2 are turned OFF and the output buffer circuit shown in FIG. 3 is inactivated.

Figure 4:
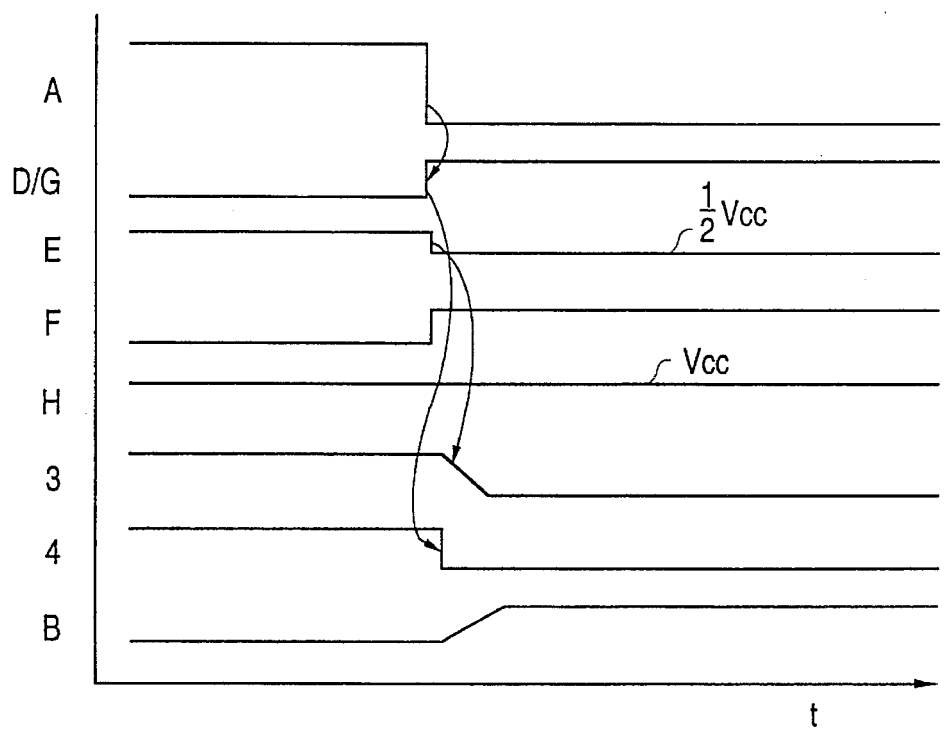
FIG. 4 is a wave form chart showing the operation of the output buffer circuit illustrated in FIG. 3.

The explanation will now be given as to the operation when the control signal C is at the active level (low level). In the first place, the operation when the input signal enters the high level from the low level is explained with reference to FIG. 4. When the input signal A enters the low level, the signals D and G are turned to the high level. At this time, the signal I enters the low level, and the transistor 17 is turned OFF while the transistor 16 is turned ON. The signal E therefore has the intermediate potential ½ $V_{cc}$ and the signal F enters the high level (see FIG. 6). Since the signal G is at the high level, the transistor 27 is in the ON state while the transistor 26 is in the OFF state, and the signal H enters the high level (see FIG. 7).

Since the signal H is at the high level, the N-channel type zero-threshold transistor 11 strongly conducts, and the gate 4 of the N-channel type transistor 2 enters the low level, whereby the transistor 2 is turned OFF. As for the N-channel type zero-threshold transistor 9 and the P-channel type transistor 10 constituting the transfer gate, only the transistor 9 is turned ON. Since the intermediate potential of ½ $V_{cc}$ is applied to the gate of the transistor 9, the transistor 9 weakly conducts. The speed of the change in the gate voltage of the output transistor 1 is thus decreased, and a large amount of the current from the power supply voltage $V_{cc}$ does not flow to the output terminal temporarily, thereby reducing the affection to the power supply voltage $V_{cc}$.

Figure 5:
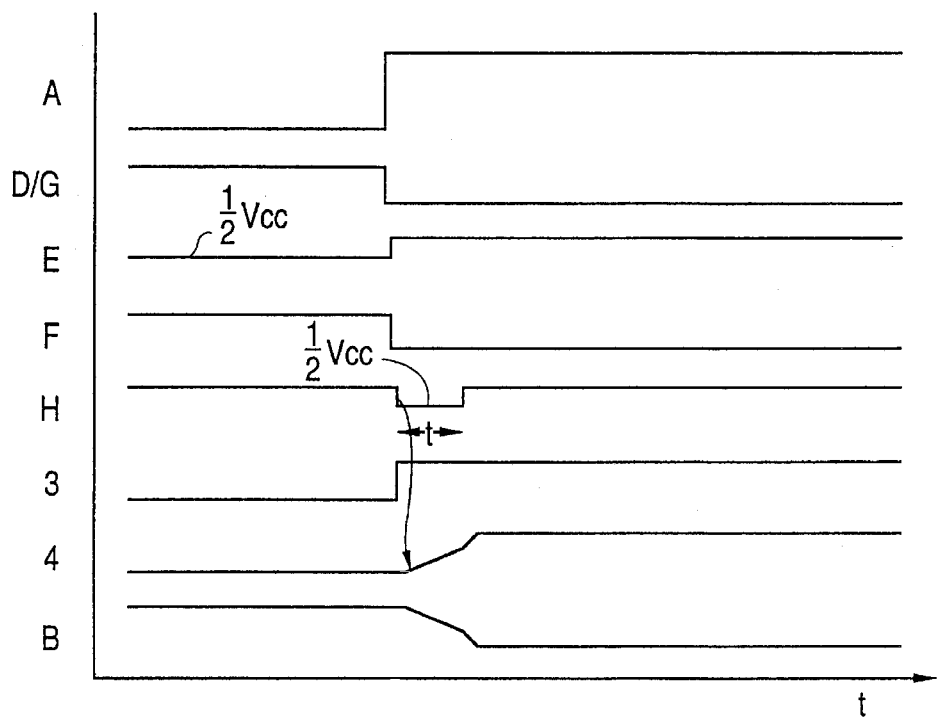
FIG. 5 is a wave form chart showing the operation of the output buffer circuit illustrated in FIG. 3.

The description will now be given as to the operation when the input signal is turned from the low level to the high level with reference to FIG. 5. When the input signal A enters the high level, the signal D and the signal G is turned to the low level. Since the signal D is on the low level, the P-channel type transistor 17 is immediately turned ON, and the output E enters the high level while the output F enters the low level. At this time, since the signal I is at the high level, the P-channel type transistor 16 is turned OFF (see FIG. 6).

Meanwhile, when the signal G is turned from the high level to the low level, the timing control circuit 21 turns the output M from the low level to high level after the elapse of the time t. The signal G and the signal M are, therefore, at the low level during the time period t after the signal G is turned from the high level to the low level, and the output 22 of the NOR circuit 20 is at the high level only during the time period t. Since the P-channel type transistor 27 is turned OFF and the signal K is at the low level during the time period t, the P-channel type transistor 26 is turned ON, resulting in the signal H having the intermediate potential ½ $V_{cc}$.

After the elapse of the time t, the signal M enters the high level and the output 22 of the NOR circuit 20 enters the low level. Accordingly, the transistor 27 is turned ON while the transistor 26 is turned OFF, and the signal H enters the normal high level (see FIG. 7).

As described above, when the input signal A is turned to the high level, the output E enters the high level while the output F is turned to the low level, and the gate voltage of the P-channel transistor 1 immediately enters the high level, whereby the transistor 1 is turned OFF. On the other hand, the signal H has the intermediate potential immediately after the input signal A is turned to the high level, and the transistor 11 weakly conducts. Accordingly, since the gate voltage 4 of the N-channel type transistor 2 is slowly increased, the amount of the current supplied to the transistor 2 is not rapidly increased. After the elapse of the time t, the signal H enters the high level, and the transistor 11 strongly conducts, Thereby further increasing the gate voltage 4. Since the potential of the output B is decreased during the time period t at this time, the amount of the current supplied to the transistor 2 is not increased even when the N-channel type transistor 2 completely conducts. Further, it is possible to prevent the output operation from being deteriorated since the transistor 2 completely enables the conduction. According to the present embodiment, the sudden increase in the ground potential can be avoided without decreasing the output operation speed.

Figure 8:
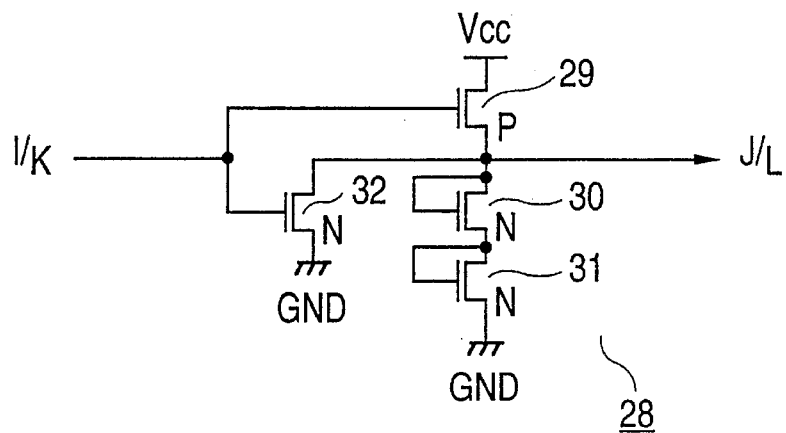
FIG. 8 is a circuit diagram showing the specific configuration of a constant voltage circuit illustrated in FIGS. 6 and 7.

FIG. 8 is a circuit diagram of the constant voltage circuit 19 or 28 illustrated in FIG. 6 or 7. This constant voltage circuit is constituted by: a P-channel type transistor 29 which receives an input signal I at a gate thereof and has a source connected to the power supply; an N-channel type transistor 32 which receives the input signal I at a gate thereof and has a source grounded; an N-channel type transistor 30 which is commonly connected to the drain of the N-channel type transistor 32 to externally output a signal J and has a gate and a drain connected to the drain of the P-channel type transistor 29; and an N-channel type transistor 31 which has a gate and a drain connected to the source of the N-channel type transistor 30 and has a source grounded.

When the signal I to be input is at the high level, the P-channel type transistor 29 is turned OFF and the N-channel type transistor 32 is turned ON, thereby outputting a signal J/L of the low level.

When the signal I to be input is at the low level, the N-channel type transistor 32 is turned OFF and the P-channel type transistor 29 is turned ON. Then the signal J which is externally output by supplying a predetermined current to the N-channel type transistors 30 and 31 has an intermediate potential which is increased by a value obtained by doubling the threshold value of the N-channel type transistors 30 and 31.

Figure 9:
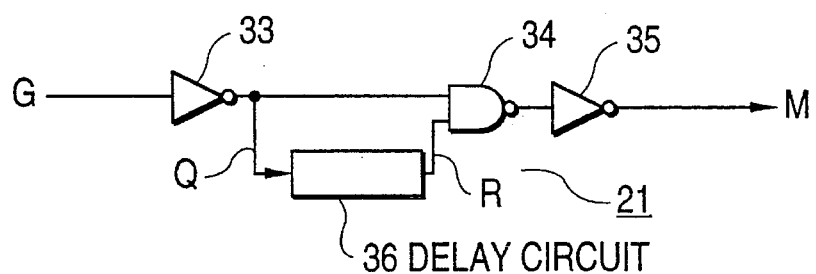
FIG. 9 is a circuit diagram showing the specific configuration of a timing control circuit illustrated in FIG. 7.

FIG. 9 is a circuit diagram of the timing control circuit 21 shown in FIG. 7. This timing control circuit 21 includes: an inverter 33 for inverting an input signal G; a delay circuit 36 for delaying an output Q supplied from the inverter 33 by a predetermined time and supplying an output R which has a positive-phase with respect to the output wave form of the inverter 33; a 2NAND 34 for receiving the output Q from the inverter 33 and the output R from the delay circuit 36; and an inverter 35 for receiving the output from the 2NAND 34 and externally supplying an output M.

The operation of this timing control circuit 21 is described as follows. When the input signal G is at the low level, both the inverter 33 and the delay circuit 36 output the high level, while the 2NAND 34 outputs the low level and the inverter 35 externally output the power supply potential M.

When the input signal G is turned from the low level to the high level, the output Q from the inverter 33 enters the low level. As a result, the output from the 2NAND 34 equals to the power supply potential, and the earth potential M is externally output from the inverter 35.

When the input signal G is turned from the high level to the low level, the output Q from the inverter 33 enters the high level from the low level, and the output from the 2NAND 34 is determined by the output R from the delay circuit 36. During the time period in which the power supply potential of the output Q is supplied to the output R of the delay circuit 36, the 2NAND 34 outputs the power supply potential, and this potential is externally output through the inverter 35 as the ground potential M. Further, when the output R from the delay circuit 36 is turned from the low level to the high level, the output from the 2NAND 34 is turned from the high level to the low level and the output M externally supplied through the inverter 35 is turned from the low level to the high level.

Figure 10:
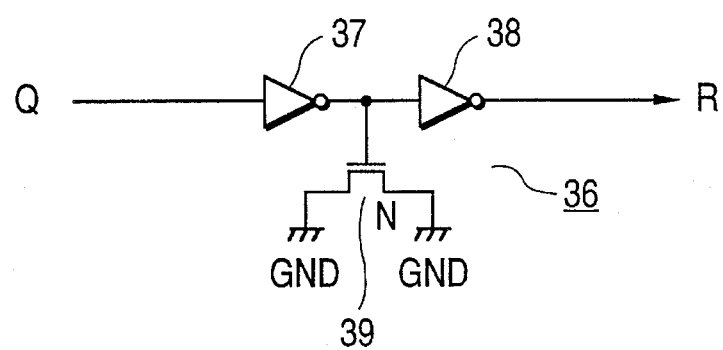
FIG. 10 is a circuit diagram showing a specific configuration of a delay circuit illustrated in FIG. 9.

FIG. 10 is a circuit diagram of the delay circuit 36 shown in FIG. 9. This delay circuit 36 consists of: an inverter 37 for inverting and outputting an input signal Q; an inverter 38 for receiving the output from the inverter 37; and an N-channel type transistor 39 which receives the output from the inverter 37 at a gate thereof and has a source and a drain grounded to be used as a capacity.

In operation, the delay circuit 36 delays the input signal Q with the load generated by the gate width and the gate length of the inverters 37 and 38 and the gate capacity of the N-channel type transistor 39 and externally supplies the output R having a positive-phase wave form.

Figure 11A:
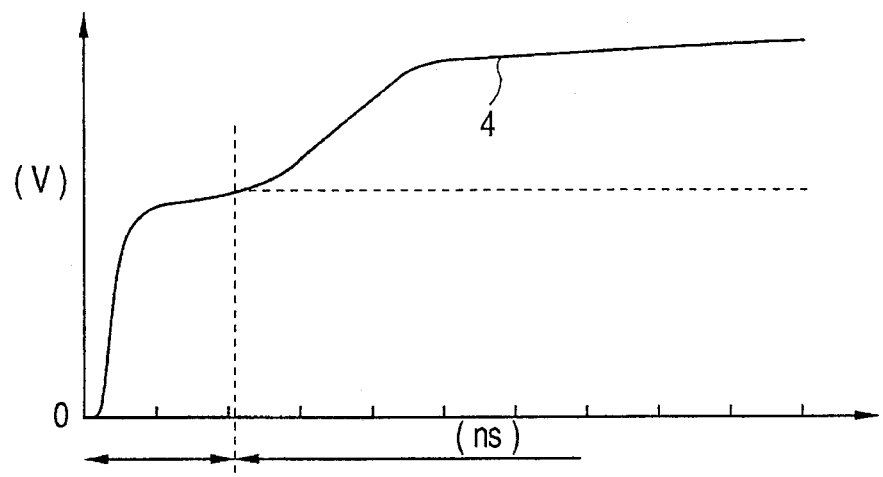
FIGS. 11(a) to (c) are wave form charts showing changes in the values of the voltage and the current in the embodiment shown in FIG. 3.
Figure 11B:
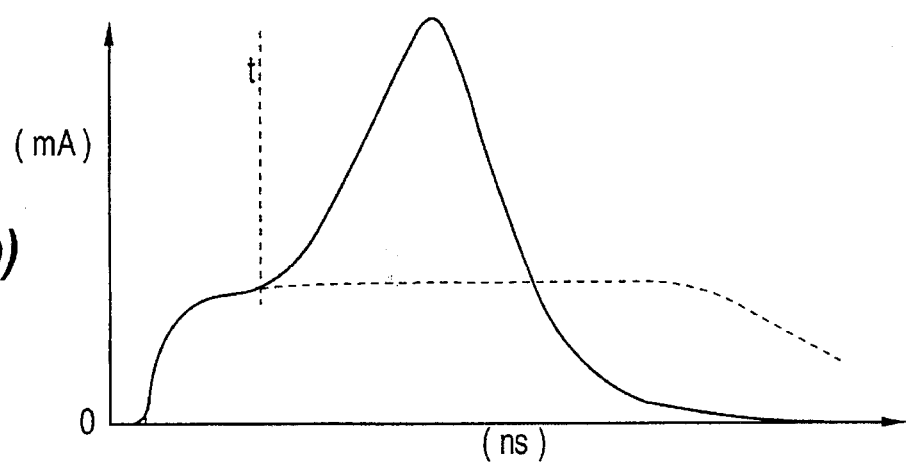
Figure 11C:
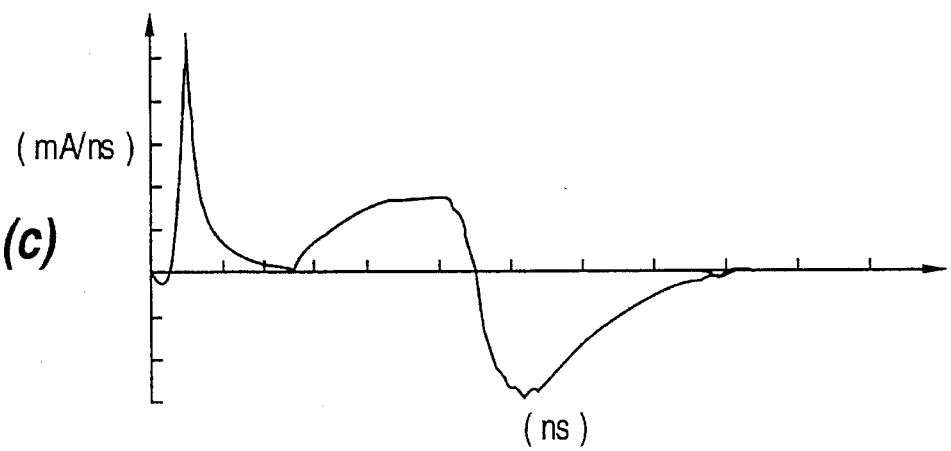

The advantages of the present embodiment will now be explained in connection with: the change in the gate voltage of the P-channel type transistor 2 (FIG. 11(a)); a current wave form of the discharge current supplied to the output signal B (FIG. 11(b)); and the time transition of the current variation of the discharge current (FIG. 11(c)), when the input signal shown in FIGS. 11 is turned from the low level to the high level. In FIGS. 11, the solid lines designate the wave forms of the present embodiment and the dotted lines denote the wave forms of the prior art.

Since the signal H has the intermediate potential before the time t determined by the timing control circuit 21, the voltage value, the current value and the current variation of the present embodiment are the same with those of the prior art. Accordingly, in this embodiment, there occurs no current variation with which the ground potential is suddenly increased, as similar to the prior art.

After the elapse of the time t, the gate voltage of the N-channel type transistor 2 again begins to be increased. The transistor 2 therefore enables the stronger conduction, and hence the potential of the output signal B is more rapidly discharged to the low level as compared with the prior art. At this time, as shown in FIG. 11(c), the current variation is smaller than that obtained immediately after the change of the input signal, and the ground potential can not be increased suddenly.

As described above, according to the present embodiment, the sudden increase in the ground potential can be avoided without reducing the output operation speed.

In the abovementioned embodiment, the description has been given as to the example in which the transfer gate constituted by the N-channel type non-dope transistor 9 and the P-channel type transistor 10 is connected to the gate 3 of the P-channel type output transistor 1, but the transfer gate has no relation to an accomplishment of the prevention of the sudden increase in the ground potential. This transfer gate and the circuit portion of the voltage control circuit shown in FIG. 6 are not therefore required necessarily, and it is possible to prevent the ground potential from being suddenly increased if the N-channel type zero-threshold transistor 11 and the circuit portion of the voltage control circuit shown in FIG. 7 are provided.

Although the invention has been described with reference to a specific embodiment, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. An output buffer circuit comprising:
a first output transistor which is provided between said output terminal and a first power supply terminal and receives an input signal at a gate thereof through a gate current controlling transistor; and
a voltage control circuit which supplies the gate of said gate current controlling transistor with a first voltage which causes said gate current controlling transistor to have a first current driving capability for a predetermined time in response to a change of said input signal to render said first output transistor conductive and generates a second voltage which causes said gate current controlling transistor to have a second current driving capability that is higher than said first current driving capability after elapse of said predetermined time.

2. An output buffer circuit as set forth in claim 1, wherein said first output transistor is a P-channel type transistor and said output buffer circuit further comprises a second output transistor which is an N-channel type zero threshold transistor and said second power supply terminal is a ground terminal.

3. An output buffer circuit as set forth in claim 1, wherein said voltage control circuit comprises:
a gate voltage control signal generation circuit which generates a control signal of a first logical level for said predetermined time and generates a control signal of a second logical level after elapse of said predetermined time in response to a change in said input signal when said second output transistor is turned from an OFF state to an ON state; and
a gate voltage generating circuit which supplies the gate of said gate current controlling transistor with said first voltage when said control signal is at the first logical level and supplies the gate of said gate current controlling transistor with said second voltage when said control signal is at the second logical level.

4. An output buffer circuit as set forth in claim 3, wherein said gate voltage signal generation circuit comprises:
a delay circuit for delaying a signal which is obtained in accordance with a change in said input signal by said predetermined time; and
a logical circuit which receives an output from said delay circuit and said input signal and generates a control signal of the first logical level for said predetermined time and generates a control signal of the second logical level after the elapse of said predetermined time.

5. An output buffer circuit as set forth in claim 1, wherein said voltage control circuit generates said second voltage value as the gate voltage of said gate current controlling transistor in response to a change in said input signal when said first output transistor is turned from the OFF state to the ON state.

6. An output buffer circuit comprising:
a P-channel type output transistor which is provided between a first power supply terminal and an output terminal and receives an input signal at a gate thereof;
an N-channel type output transistor which is provided between said output terminal and a second power supply and has a gate;
a means for supplying said input signal to the gate of said N-channel type output transistor through a gate current controlling transistor; and
a voltage control generation circuit which generates as a gate voltage of said gate current controlling transistor a first voltage value which is smaller than a value of a power supply voltage and enables conduction of said gate current controlling transistor with a predetermined resistance value for a predetermined time in response to a change of the level of said input signal from a low level to a high level and further generates a second voltage value which is higher than said first voltage value after elapse of said predetermined time.

7. An output buffer circuit as set forth in claim 6, wherein said voltage control circuit comprises:
a gate voltage control signal generation circuit which generates a control signal of a first logical level for said predetermined time in response to a change of the level of said input signal from the low level to the high level and further generates a control signal of a second logical level after elapse of said predetermined time; and a gate voltage generation circuit which supplies the gate of said gate current controlling transistor with said first voltage value when said control signal is at the first logical level and supplies the gate of said gate current controlling transistor with said second voltage value when said control signal is at the second logical level.

8. An output buffer circuit comprising:

an NOR circuit for receiving an input signal and a control signal;

a first inverter for receiving an output from said NOR circuit;

a first P-type MOS transistor whose source is connected to a power supply;

a first N-type MOS transistor which has a source grounded and a drain connected to a drain of said first P-type MOS transistor and outputs an output signal;

a first transfer gate which includes by a second P-type MOS transistor whose source is connected to an output of said first inverter and whose drain is connected to a gate of said first P-type MOS transistor and a second N-type MOS transistor;

a NAND circuit for receiving said input signal and an inverted signal obtained from said control signal;

a second inverter for receiving an output from said NAND circuit;

a second transfer gate which includes a third N-type MOS transistor having a source connected to an output of said second inverter and a drain connected to a gate of said first N-type MOS transistor; and a voltage control circuit which receives said control signal, an output from said NOR circuit and an output from said NAND circuit, and which has a first output connected to a gate of said second P-type MOS transistor, a second output connected to a gate of said third N-type MOS transistor and a third output connected to a gate of said second N-type MOS transistor, thereby gradually changing an output to a gate of said first or second gate transfer from an intermediate potential equal to or lower than the power supply potential to the power supply potential during a time period in which the potential of said output signal is turned to the power supply potential or a ground potential.

9. An output buffer circuit as set forth in claim 8, wherein said second N-type MOS transistor in said first transfer gate and said third N-type MOS transfer in said second transfer gate are N-type zero threshold transistors.

* * * * *